United States Patent
Ishida

(10) Patent No.: US 9,741,534 B2
(45) Date of Patent: Aug. 22, 2017

(54) MONITORING DEVICE, ION IMPLANTATION DEVICE, AND MONITORING METHOD

(71) Applicant: LAPIS Semiconductor Co., Ltd., Kanagawa (JP)

(72) Inventor: Makoto Ishida, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 15/003,311

(22) Filed: Jan. 21, 2016

(65) Prior Publication Data

US 2016/0217973 A1    Jul. 28, 2016

(30) Foreign Application Priority Data

Jan. 27, 2015  (JP) ................ 2015-013460

(51) Int. Cl.
*H01J 37/304* (2006.01)
*H01J 37/36* (2006.01)
*H01J 37/317* (2006.01)
*H01J 37/244* (2006.01)
*G01R 19/00* (2006.01)

(52) U.S. Cl.
CPC .......... *H01J 37/304* (2013.01); *H01J 37/244* (2013.01); *H01J 37/3171* (2013.01); *G01R 19/0061* (2013.01); *H01J 2237/24495* (2013.01); *H01J 2237/30472* (2013.01); *H01J 2237/31703* (2013.01)

(58) Field of Classification Search
CPC ............... H01J 37/304; H01J 37/3171; H01J 2237/31703; H01J 2237/30472; G01R 19/0092
USPC ... 250/492.1, 492.2, 492.21, 492.22, 492.23, 250/492.3
See application file for complete search history.

(56) References Cited

U.S. PATENT DOCUMENTS 8,853,653 B1 * 10/2014 Todorov .................. C23C 14/48
                                                            250/492.21

FOREIGN PATENT DOCUMENTS

JP    H07-57671 A    3/1995

* cited by examiner

*Primary Examiner* — Nicole Ippolito
(74) *Attorney, Agent, or Firm* — Volentine & Whitt, PLLC

(57) ABSTRACT

A monitoring device includes a filtering section that extracts and outputs at least one of a high frequency component or a low frequency component of a beam current received from a detection output section of an ion implantation device; and a computation section that computes at least one of a value corresponding to a content ratio of the high frequency component in the beam current, or a value corresponding to a content ratio of the low frequency component in the beam current.

9 Claims, 3 Drawing Sheets

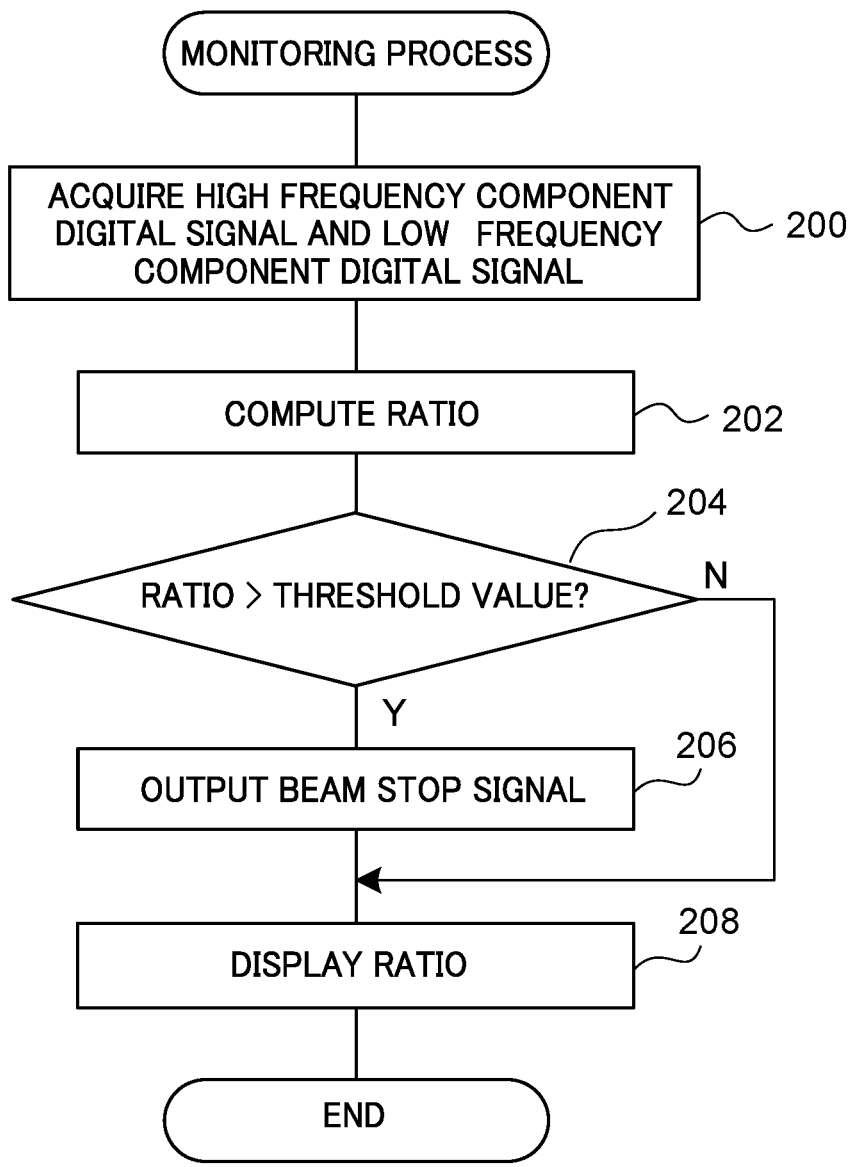

MONITORING DEVICE, ION IMPLANTATION DEVICE, AND MONITORING METHOD

CROSS-REFERENCE TO RELATED APPLICATION

This application claims priority under 35 USC 119 from Japanese Patent Application, No. 2015-013460, filed on Jan. 27, 2015, the disclosure of which is incorporated by reference herein.

BACKGROUND

Technical Field

The present disclosure relates to a monitoring device, an ion implantation device, and a monitoring method.

Related Art

An ion implantation device that implants impurities into a wafer, which is a semiconductor substrate, by generating an ion beam and radiating the generated ion beam onto the wafer, is known. The state of the ion beam has a large influence on the physical properties of the wafer, and there is therefore a demand to ascertain the state of the ion beam with high precision.

In the ion implantation device, a Faraday cup connected to an oscilloscope is provided, and a beam current produced by irradiation of the ion beam onto the Faraday cup is measured by the oscilloscope, enabling determination to be made as to whether or not the state of the ion beam is correct.

However, various types of noise are generated during the generation process and the irradiation process of the ion beam, and the generated noise is superimposed on the beam current. In a case in which the noise is superimposed on the beam current, this makes it difficult to determine with high precision whether or not the state of the ion beam is correct from the measurement results of the oscilloscope.

As technology that enables a highly precise determination as to whether or not the state of the ion beam is correct, a technology that subtracts noise components, measured similarly to the beam current, from current value integration data based on values of the beam current is known (for example, see Japanese Patent Application Laid-Open (JP-A) No. H07-57671).

However, although the above technology enables the approximate state of the beam current to be ascertained, noise is not entirely eliminated from the beam current, and is difficult to ascertain the noise that was not completely eliminated from the beam current.

Examples of noise not completely eliminated from the beam current include noise produced by causes such as degradation and fouling over time. Noise produced by causes such as degradation and fouling over time refers to, for example, noise produced as a result of insulating flaws being generated by degradation, fouling, and the like over time, at locations at which insulation must be maintained in order to apply the voltage required for ion beam formation. Likewise, noise produced by degradation or malfunction of a power source may not be eliminated from the beam current.

SUMMARY

The present disclosure provides a monitoring device, an ion implantation device, and a monitoring method that may ascertain included in a beam current with higher precision than in cases in which noise components are measured similarly to the beam current.

A first aspect of the present disclosure is a monitoring device including: a filtering section that extracts and outputs at least one of a high frequency component or a low frequency component of a beam current received from a detection output section of an ion implantation device; and a computation section that computes at least one of a value corresponding to a content ratio of the high frequency component in the beam current, or a value corresponding to a content ratio of the low frequency component in the beam current.

A second aspect of the present disclosure is an ion implantation device including: the monitoring device of the first aspect; an irradiation generation section that generates and irradiates an ion beam; and the detection output section, which detects a beam current due to the ion beam irradiated by the irradiation generation section and outputs the beam current to the monitoring device.

A third aspect of the present disclosure is a monitoring method including: extracting and outputting at least one of a high frequency component or a low frequency component of a beam current received from a detection output section of an ion implantation device; and computing at least one of a value corresponding to a content ratio of the high frequency component in the beam current, or a value corresponding to a content ratio of the low frequency component in the beam current.

According to the above aspects, noise included in a beam current may be ascertained with higher precision than in cases in which noise components are measured similarly to the beam current.

BRIEF DESCRIPTION OF THE DRAWINGS

Exemplary embodiments will be described in detail based on the following figures, wherein:

FIG. 3 is a flowchart illustrating a flow of monitoring processing executed by a monitoring device of an ion implantation system according to an exemplary embodiment.

DETAILED DESCRIPTION

Detailed explanation follows regarding an exemplary embodiment of the present disclosure, with reference to the drawings.

Figure 1:
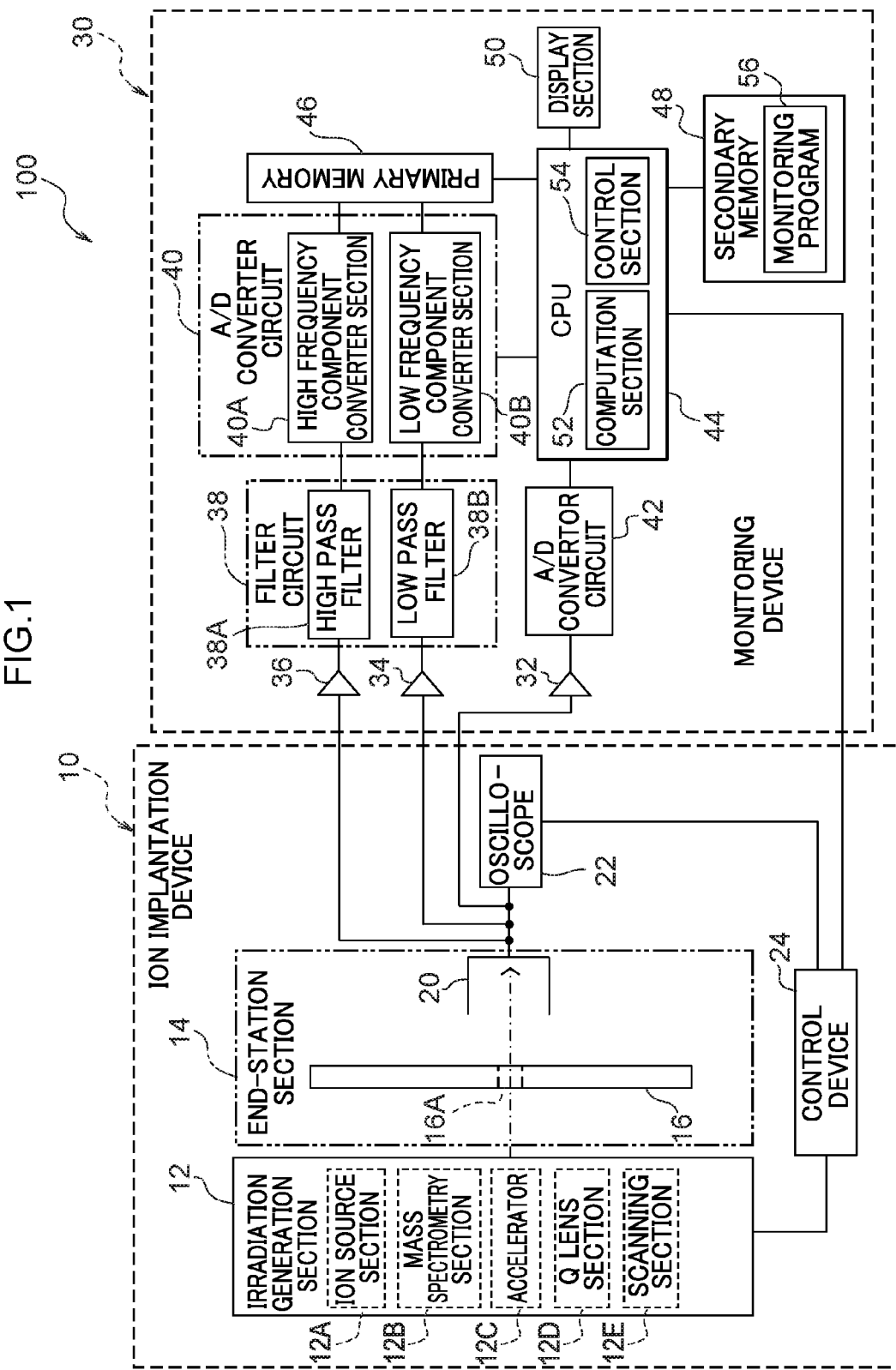
FIG. 1 is a configuration diagram illustrating an overall configuration of an ion implantation system according to an exemplary embodiment.

As an example, as illustrated in FIG. 1, an ion implantation system 100 includes an ion implantation device 10 and a monitoring device 30.

The ion implantation device 10 includes an irradiation generation section 12 and an end-station section 14. The irradiation generation section 12 generates and irradiates an ion beam. The irradiation generation section 12 includes an ion source section 12A, a mass spectrometry section 12B, an accelerator 12C, a Q lens section 12D, and a scanning section 12E.

The ion source section 12A also includes an ion source (not illustrated in the drawings) and a power source (not illustrated in the drawings). The ion source is driven when the power source is switched ON, and ions are generated from the ion source. Ions generated from the ion source are extracted by an extraction electrode (not illustrated in the drawings), and are introduced to the mass spectrometry section 12B as an ion beam.

The mass spectrometry section 12B uses differences in the mass and charge of the ions to split the ion beam introduced by the ion source section 12A, and extracts, for introduction to the accelerator 12C, only the ion beam formed by needed ions.

The accelerator 12C accelerates the ion beam by imparting the necessary energy to the ion beam. The energy imparted to the ion beam is controlled by a voltage applied by the accelerator 12C. The voltage applied by the accelerator 12C is determined according to the depth and the implantation amount at which to implant the ion beam into a wafer 18.

The Q lens section 12D shapes the ion beam by causing the ion beam, which has been accelerated by the accelerator 12C, to converge.

The scanning section 12E scans the ion beam, which has been shaped by the Q lens section 12D, in a vertical direction and in a horizontal direction.

Figure 2:
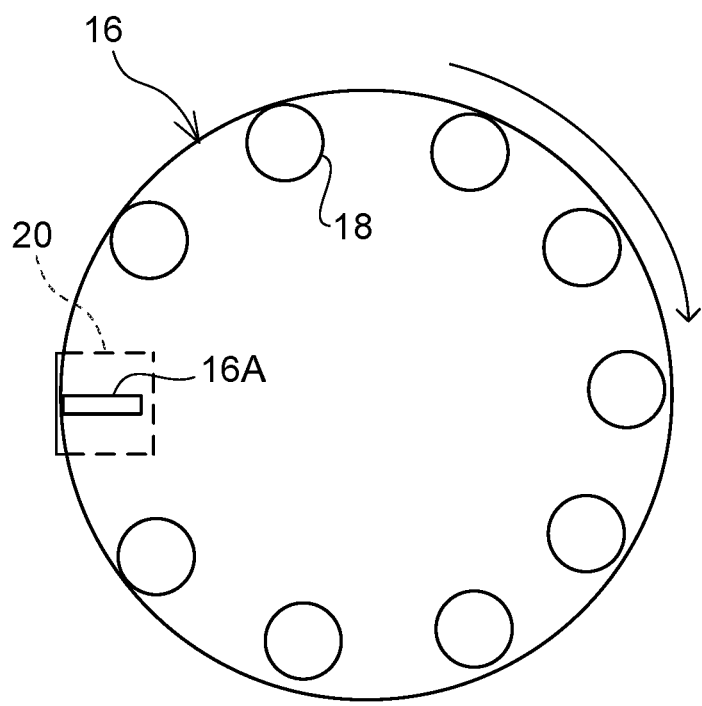
FIG. 2 is a front view illustrating a disc included in an ion implantation device of an ion implantation system according to an exemplary embodiment.

The ion implantation device 10 is an ion implantation device that performs batch processing. Accordingly, the ion implantation device 10 is provided with a disc 16 at the end-station section 14, and as an example, as illustrated in FIG. 2, plural wafers 18 are attached to a circumferential edge portion of the front face of the disc 16, along the circumferential direction. The disc 16, for example, rotates in the direction of the curved arrow illustrated in FIG. 2 at a predetermined speed due to receiving a driving force transmitted from a motor (not illustrated in the drawings). In a state in which the disc 16 has been rotated, the ion beam is irradiated by the scanning section 12E onto the wafer 18.

A slit 16A is formed to a portion of the circumferential edge portion of the disc 16, and a Faraday cup 20, which is an example of a detection output section according to the present disclosure, is provided to the back face side of the disc 16 at a position corresponding to the position of the slit 16A. Accordingly, in a case in which the slit 16A arrives at the irradiation position of the ion beam with rotation of the disc 16, the ion beam passes through the slit 16A and is irradiated onto the Faraday cup 20. The Faraday cup 20 detects the beam current produced by direct reception of the irradiated ion beam, and outputs the beam current.

The ion implantation device 10 includes an oscilloscope 22 and a control device 24. An input terminal of the oscilloscope 22 is connected to an output terminal of the Faraday cup 20, and the oscilloscope 22 measures the magnitude of the beam current input from the Faraday cup 20 and displays the measurement result on a display (not illustrated in the drawings).

The control device 24 controls the ion implantation device 10 overall. The control device 24 is connected to the output terminal of the oscilloscope 22. Accordingly, the control device 24 can ascertain the magnitude of the beam current measured by the oscilloscope 22.

The control device 24 is connected to the irradiation generation section 12, and adjusts the ion beam by controlling the irradiation generation section 12 such that the magnitude of the beam current measured by the oscilloscope 22 becomes a predetermined magnitude.

The monitoring device 30 includes amplifiers 32, 34, 36, a filter circuit 38, A/D converter circuits 40, 42, a central processing unit (CPU) 44, primary memory 46, secondary memory 48, and a display section 50.

Input terminals of the amplifiers 32, 34, 36 are connected to the output terminal of the Faraday cup 20. The amplifiers 32, 34, 36 convert the beam current input from the Faraday cup 20 into a voltage. Then, the amplifiers 32, 34, 36 amplify analog signals indicating the voltage obtained by the conversion by a predetermined factor, and outputs the amplified analog signal. Note that for convenient explanation, the analog signals output from the amplifiers 32, 34, 36 are referred to as "voltage analog signals" hereafter.

The output terminal of the amplifier 32 is connected to an input terminal of the A/D converter circuit 42. The A/D converter circuit 42 converts the voltage analog signal input from the amplifier 32 into a digital signal, and outputs the digital signal. Note that for convenient explanation, the digital signal obtained by conversion by the A/D converter circuit 42 is referred to as the "voltage digital signal" hereafter.

The filter circuit 38, which is an example of a filtering section according to the present disclosure, includes a high pass filter 38A and a low pass filter 38B, and the filter circuit 38 extracts and outputs the high frequency components and the low frequency components of the beam current output by the Faraday cup 20.

The input terminal of the high pass filter 38A is connected to the output terminal of the amplifier 36. The high pass filter 38A extracts and outputs the signal of the high frequency components from the voltage analog signal input from the amplifier 36. Here, high frequency components are high frequency components that can be recognized as noise and is obtained in advance by testing or simulation. Note that for convenient explanation, the signal of the high frequency components extracted by the high pass filter 38A is referred to as the "high frequency component analog signal" hereafter.

An input terminal of the low pass filter 38B is connected to the output terminal of the amplifier 34. The low pass filter 38B extracts and outputs the signal of the low frequency components from the voltage analog signal input from the amplifier 34. Here, the low frequency components are low frequency components that can be recognized as noise and is obtained in advance by testing or simulation. Note that for convenient explanation, the signal of the low frequency components extracted by the low pass filter 38B is referred to as the "low frequency component analog signal" hereafter.

The A/D converter circuit 40, which is an example of an A/D converter according to the present disclosure, includes a high frequency component converter section 40A and a low frequency component converter section 40B.

An input terminal of the high frequency component converter section 40A is connected to an output terminal of the high pass filter 38A, and the high frequency component converter section 40A converts and outputs the high frequency component analog signal input from the high pass filter 38A into a digital signal. Note that for convenient explanation, the digital signal obtained by conversion of the high frequency component analog signal by the high frequency component converter section 40A is referred to as the "high frequency component digital signal" hereafter.

The low frequency component converter section 40B is connected to an output terminal of the low pass filter 38B, and the low frequency component converter section 40B converts and outputs the low frequency component analog signal input from the low pass filter 38B into a digital signal. Note that the digital signal obtained by conversion of the low frequency component analog signal by the low frequency component converter section 40B is referred to as the "low frequency component digital signal" hereafter.

The primary memory 46 is volatile memory, and is connected to an output terminal of the high frequency component converter section 40A and an output terminal of the low frequency component converter section 40B. Accordingly, a high frequency component digital signal from the high frequency component converter section 40A, and a low frequency component digital signal from the low frequency component converter section 40B are input to the primary memory 46. The primary memory 46 holds the input high frequency component digital signal and low frequency component digital signal.

The secondary memory 48 is nonvolatile memory (for example, flash memory or a hard disk drive (HDD)) that pre-stores a monitoring program 56, various parameters, and the like.

The CPU 44 controls the monitoring device 30 overall. The A/D convertor circuits 40, 42, the primary memory 46, and the secondary mommy 48 are connected to the CPU 44. Accordingly, the CPU 44 can control the A/D convertor circuit 40, can acquire the voltage digital signal from the A/D convertor circuit 42, can acquire the high frequency component digital signal and the low frequency component digital signal from the primary memory 46, and can acquire the monitoring program 56 from the secondary memory 48.

The display section 50 is connected to the CPU 44, and the display section 50 displays various information under control of the CPU 44. Note that examples of the display section 50 include a liquid crystal display.

The CPU 44 is connected to the control device 24 of the ion implantation device 10 through an input interface (not illustrated in the drawings). Accordingly, the CPU 44 can control the irradiation generation section 12 through the control device 24.

The CPU 44 includes a computation section 52 and a control section 54. The computation section 52 computes values corresponding to the content ratio of the high frequency components of the beam current, namely, values corresponding to the content ratio of the high frequency components output by the filter circuit 38 with respect to the beam current. Moreover, the computation section 52 computes values corresponding to the content ratio of the low frequency components of the beam current, namely, values corresponding to the content ratio of the low frequency components output by the filter circuit 38 with respect to the beam current. The control section 54 controls the ion implantation device 10 such that generation of the ion beam is stopped when the value computed by the computation section 52 exceeds a threshold value.

The CPU 44 operates as the computation section 52 and the control section 54 by acquiring the monitoring program 56 from the secondary memory 48, expanding the acquired monitoring program 56 into volatile memory (not illustrated in the drawings) employed as, for example, a work area during execution of various programs, and executing the monitoring program 56.

Although an example is given in which the monitoring program 56 is acquired from the secondary memory 48, it is not necessary for the monitoring program 56 to be initially stored in the secondary memory 48. For example, the monitoring program 56 may first be stored to a freely selected portable storage medium such as a solid state drive (SSD), a DVD disc, an IC card, a magneto-optical disc, or a CD-ROM employed connected to the monitoring device 30. Then, the CPU 44 may acquire the monitoring program 56 from the portable storage medium and execute the monitoring program 56. Moreover, the monitoring program 56 may be stored on storage section such as another computer or a server device connected to the monitoring device 30 through a communications network (not illustrated in the drawings), and the CPU 44 may acquire the monitoring program 56 from the other server or the server device, and execute the monitoring program 56.

Next, explanation follows regarding operation of an ion implantation system 100 according to the present exemplary embodiment.

In the ion implantation device 10, rotation of the disc 16, to which to the wafers 18 are attached, is started, and when the rotation speed reaches a predetermined speed and stabilizes, irradiation of the ion beam onto an inner circumferential region of the disc 16 by the irradiation generation section 12 is started. The ion beam is irradiated onto the wafers 18 on the disc 16, and ions are thereby implanted into the wafers 18. Moreover, the ion beam is irradiated onto the Faraday cup 20 through the slit 16A with rotation of the disc 16. When the ion beam is irradiated onto the Faraday cup 20, the beam current is detected and output by the Faraday cup 20.

In the monitoring device 30, the beam current input from the Faraday cup 20 is converted into respective voltage analog signals by the amplifiers 32, 34, 36, and respective voltage analog signals obtained by the conversions are output by the amplifiers 32, 34, 36.

Note that noise is superimposed on the beam current, and the noise may be broadly categorized as noise having high frequency components and noise having low frequency components.

In the monitoring device 30, a high frequency component analog signal corresponding to the high frequency components of the noise is extracted from the voltage analog signal and output by the high pass filter 38A. Moreover, a low frequency component analog signal corresponding to the low frequency component of the noise is extracted from the voltage analog signal and output by the low pass filter 38B.

The high frequency component analog signal output by the high pass filter 38A is converted into a high frequency component digital signal by the high frequency component converter section 40A and is output to the primary memory 46. The high frequency component digital signal is then held by the primary memory 46.

The low frequency component analog signal output by the low pass filter 38B is converted into a low frequency component digital signal by the low frequency component converter section 40B and is output to the primary memory 46. The low frequency component digital signal is then held by the primary memory 46.

The voltage analog signal input to the A/D convertor circuit 42 from the amplifier 32 is converted to a voltage digital signal by the A/D convertor circuit 42 and is output to the CPU 44.

Next, explanation follows regarding monitoring processing implemented by the CPU 44 executing the monitoring program 56 in cases in which the voltage digital signal, obtained in accordance with generation of the beam current by the Faraday cup 20, is input to the CPU 44, with reference to FIG. 3. Note that for convenient explanation, a case in which the primary memory 46 already holds the high frequency component digital signal and the low frequency component digital signal related to the voltage digital signal input to the CPU 44, will be described.

In the monitoring processing illustrated in FIG. 3, first, at step 200, the computation section 52 acquires the high frequency component digital signal and the low frequency component digital signal from the primary memory 46, and then processing proceeds to step 202.

At step 202, the computation section 52 computes the ratio of the signal level of the high frequency component digital signal to the signal level of the voltage digital signal (an example of a value corresponding to a content ratio according to the present disclosure). Moreover, the computation section 52 computes the ratio of the signal level of the low frequency component digital signal to the signal level of the voltage digital signal (an example of a value corresponding to a content ratio according to the present disclosure).

Note that for convenient explanation, the ratio of the signal level of the high frequency component digital signal to the signal level of the voltage digital signal is referred to as the "high frequency component side ratio" hereafter. Moreover, for convenient explanation, the ratio of the signal level of the low frequency component digital signal to the signal level of the voltage digital signal is referred to as the "low frequency component side ratio" hereafter. Moreover, for convenient explanation, the high frequency component side ratio and the low frequency component side ratio are simply referred to as the "ratio" when there is no need to distinguish between them.

At the next step 204, the computation section 52 determines whether or not the ratio computed at step 202 exceeds the threshold value. The threshold value is broadly categorized into a first threshold value and a second threshold value. The first threshold value is employed to compare with the high frequency component side ratio, and the second threshold value is employed to compare with the low frequency component side ratio. Here, cases in which the ratio computed at step 202 exceeds the threshold value refer to cases in which, for example, at least one of the high frequency component side ratio or the low frequency component side ratio exceed the corresponding threshold value.

The first threshold value is a value obtained in advance, by testing or simulation, as a value for detecting high frequency component noise amongst the high frequency component noise at a level that cannot be ignored. The second threshold value is a value obtained in advance, by testing or simulation, as a value for detecting low frequency component noise amongst the low frequency component noise at a level that cannot be ignored. Here, at a level that cannot be ignored means, for example, a level obtained in advance by testing or simulation, as a level that a defective product would be manufactured were irradiation of the ion beam continues.

Note that the values employed as the first threshold value and the second threshold value are both constant values in the present exemplary embodiment. However, variable values that change according to an instruction received from a reception device such as a touch panel or keyboard (not illustrated in the drawings) may be employed.

In cases in which the ratio computed at step 202 exceeds the threshold value at step 204, affirmative determination is made, and processing proceeds to step 206. In cases in which the ratio computed at step 202 is the threshold value or lower at step 204, negative determination is made, and processing proceeds to step 208.

At step 206, the control section 54 outputs a beam stop signal instructing stop of ion beam generation to the control device 24. In response, in a case in which the beam stop signal is input to the control device 24, the control device 24 controls the irradiation generation section 12 such that ion beam generation by the irradiation generation section 12 is stopped.

At the next step 208, the computation section 52 displays the ratio computed at step 202 on the display section 50, and the current monitoring processing then ends.

In a case in which the processing of step 208 is executed, the ratio of the high frequency component side and the ratio of the low frequency component side are displayed by the display section 50 converted into numerical values, for example, as percentages like "high frequency components: xx %, low frequency components: yy %". Although an example is given here of visual display by the display section 50, an audible representation using sound output by a speaker (not illustrated in the drawings) may be employed instead of the visual display, and it goes without saying that a visual display and an audible representation may be employed in combination.

As explained above, in the monitoring device 30, high frequency components and low frequency components in the beam current are extracted and output by the filter circuit 38. Then, the computation section 52 computes the high frequency component side ratio as the value corresponding to the content ratio of the high frequency components output by the filter circuit 38 with respect to the beam current. Moreover, the computation section 52 computes the low frequency component side ratio as the value corresponding to the content ratio of the low frequency components output by the filter circuit 38 with respect to the beam current. Accordingly, noise included in the beam current produced by causes such as degradation and fouling over time may be ascertained with higher precision than in cases in which the noise components are measured similarly to the beam current.

Thus, in a case in which noise included in the beam current produced by degradation, fouling, and the like with time may be ascertained with high precision, and the user may make adjustments to the ion beam with more precision, thereby preemptively preventing defective products (defective wafers) from being generated accompanying insufficient uniformity of ion implantation during the ion implantation process.

Moreover, in the monitoring device 30, the high frequency component analog signal is converted to the high frequency component digital signal by the high frequency component converter section 40A, and the low frequency component analog signal is converted to the low frequency component digital signal by the low frequency component converter section 40B. Then, the high frequency component side ratio and the low frequency component side ratio employing the high frequency component digital signal and the low frequency component digital signal are computed by the computation section 52, and the computed high frequency component side ratio and low frequency component side ratio are displayed on the display section 50. Accordingly, the extent of the noise included in the beam current produced by degradation, fouling, and the like with time may be made easier for the user to know than in cases in which the high frequency component side ratio and the low frequency component side ratio are not displayed.

Moreover, in the monitoring device 30, in a case in which the ratio computed by the computation section 52 has exceeded the threshold value, the ion implantation device 10 is controlled by the control section 54 such that generation of the ion beam is stopped. Accordingly, production of defective products may be suppressed, in contrast to cases in which generation of the ion beam is not stopped even when the ratio computed by the computation section 52 exceeds the threshold value.

Moreover, batch processing is performed in the ion implantation device 10. Accordingly, manufacturing efficiency may be increased compared to cases in which single-wafer processing is performed.

Although an example has been given of a case in which the computation section 52 computes the high frequency component side ratio and the low frequency component side ratio in the above exemplary embodiment, the present disclosure is not limited thereto. For example, the computation section 52 may compute at least one of the ratio of the signal level of the high frequency component digital signal to the signal level of the voltage digital signal, or the ratio of the signal level of the low frequency component digital signal to the signal level of the voltage digital signal. Thus, in the monitoring device 30, it is sufficient for the computation section 52 to compute at least one of the value corresponding to the content ratio of the high frequency components included in the beam current, or a value corresponding to the content ratio of the low frequency components included in the beam current.

Moreover, although explanation has been given regarding an example of a case in which the monitoring device 30 includes the high pass filter 38A and the low pass filter 38B in the above exemplary embodiment, the present disclosure is not limited thereto. The monitoring device 30 may include the high pass filter 38A or the low pass filter 38B alone.

Moreover, although an example has been given regarding a case in which the high frequency component side ratio and the low frequency component side ratio are computed in the above exemplary embodiment, the present disclosure is not limited thereto. The high frequency component side ratio or the low frequency component side ratio alone may be computed.

Moreover, although the ion beam generation is stopped in cases in which the at least one of the high frequency component side ratio or the low frequency component side ratio exceeds the corresponding threshold value, the present disclosure is not limited thereto. For example, the ion beam generation may be stopped only in cases in which the high frequency component side ratio and the low frequency component side ratio both exceed the respective threshold values. Moreover, the ion beam generation may be stopped only in cases in which the high frequency component side ratio exceeds the first threshold value. Moreover, the ion beam generation may be stopped only in cases in which the low frequency component side ratio exceeds the second threshold value.

Moreover, although an example has been given of a case in which the ion implantation device 10 is controlled by the control section 54 such that the ion beam generation is stopped in the present exemplary embodiment, the present disclosure is not limited thereto. For example, the ion implantation device 10 may be controlled by the control section 54 such that the output level of the ion beam is lowered to below the current level without stopping output of the ion beam.

Moreover, although an example has been given of a batch-type ion implantation device 10 in the present exemplary embodiment, the present disclosure is not limited thereto. It goes without saying that the present disclosure may also be applied to single-wafer-type ion implantation devices.

Moreover, although explanation has been given regarding an example in which the Faraday cup 20 is disposed at the back face side of the disc 16 in the present exemplary embodiment, the present disclosure is not limited thereto. For example, the Faraday cup 20 may be disposed at a position adjacent to a wafer 18 attached to the disc 16, or at the outer circumferential face side of the disc 16.

Moreover, although an example has been given of a case in which the monitoring device 30 is attached to the ion implantation device 10 in the present exemplary embodiment, the present disclosure is not limited thereto. The monitoring device 30 may be housed in the ion implantation device 10.

Moreover, the monitoring processing (see FIG. 3) explained in the above exemplary embodiment is merely an example. Accordingly, it goes without saying that unnecessary steps may be omitted, new steps may be added, and the processing sequence may be rearranged, within a range not departing from the spirit thereof.

Moreover, although an example has been given of a software-based configuration in which each step of the monitoring program 56 is implemented by the CPU 44 in the above exemplary embodiment, the present disclosure is not limited thereto. Other examples include a hardware-based configuration configured by various circuits (for example, application specific integrated circuits (ASIC)) connected together, and a mode that combines the software-based configuration and the hardware-based configuration.

Moreover, in the present exemplary embodiment, although explanation has been given regarding a case in which the high frequency component side ratio and the low frequency component side ratio are displayed on the display section 50, the present disclosure is not limited thereto. The noise generation source may also be displayed on the display section 50. In such cases, a noise generation source derivation table defining correspondence relationships between the high frequency component side ratio and low frequency component side ratio, and noise generation sources may be pre-stored in the secondary memory 48. Then, the computation section 52 may derive the noise generation source from the computed high frequency component side ratio and low frequency component side ratio using the noise generation source derivation table, and information identifying the derived noise generation source may be displayed on the display section 50.

What is claimed is:

1. A monitoring device comprising:
    a filtering section that extracts and outputs at least one of a high frequency component or a low frequency component of a beam current received from a detection output section of an ion implantation device; and
    a computation section that determines at least one of a value corresponding to a content ratio of the high frequency component in the beam current, or a value corresponding to a content ratio of the low frequency component in the beam current.

2. The monitoring device of claim 1, wherein:
    the filtering section outputs the high frequency component and the low frequency component as an analog signal;
    the monitoring device further comprises an A/D converter that converts the analog signal into a digital signal; and
    the computation section determines the value using the digital signal, and causes the determined value to be displayed on a display section.

3. The monitoring device of claim 1, further comprising a control section that controls the ion implantation device such that the ion beam is suppressed in cases in which the value determined by the computation section has exceeded a threshold value.

4. An ion implantation system comprising:
    the monitoring device and the ion implantation device of claim 1, wherein the ion implantation device comprises
an irradiation generation section that generates and irradiates the ion beam; and
the detection output section, which detects the beam current due to the ion beam irradiated by the irradiation generation section and outputs the beam current to the monitoring device.

5. The ion implantation system of claim 4, configured to perform batch processing.

6. The monitoring device of claim 1, wherein the filtering section outputs the high frequency component and the low frequency component as an analog signal.

7. The monitoring device of claim 1, further comprising an A/D converter that converts the high frequency component and the low frequency component into a digital signal.

8. The monitoring device of claim 1, wherein the computation section determines the value based on a digital representation of the high frequency component and the low frequency component, and causes the determined value to be displayed on a display.

9. A monitoring method comprising:
extracting and outputting at least one of a high frequency component or a low frequency component of a beam current received from a detection output section of an ion implantation device; and
determining at least one of a value corresponding to a content ratio of the high frequency component in the beam current, or a value corresponding to a content ratio of the low frequency component in the beam current.

* * * * *